(12) United States Patent
Sheats

(10) Patent No.: US 7,334,737 B2
(45) Date of Patent: Feb. 26, 2008

(54) THIN FILM NON VOLATILE MEMORY DEVICE SCALABLE TO SMALL SIZES

(75) Inventor: James Sheats, Palo Alto, CA (US)

(73) Assignee: Intelleflex Corp., San Jose, CA (US)

( * ) Notice: Subject to any disclaimer, the term of this patent is extended or adjusted under 35 U.S.C. 154(b) by 416 days.

(21) Appl. No.: 11/034,634

(22) Filed: Jan. 13, 2005

(65) Prior Publication Data

US 2006/0151616 A1    Jul. 13, 2006

(51) Int. Cl.
*G06K 19/06* (2006.01)

(52) U.S. Cl. ..................................... 235/492

(58) Field of Classification Search ........... 235/492; 365/112
See application file for complete search history.

(56) References Cited

U.S. PATENT DOCUMENTS

| | | | |
|---|---|---|---|
| 4,566,086 A | * | 1/1986 | Anderson ............... 369/13.01 |
| 5,326,678 A | * | 7/1994 | Kojima et al. .......... 430/270.17 |
| 5,327,373 A | | 7/1994 | Liu et al. |
| 5,424,974 A | | 6/1995 | Liu et al. |

* cited by examiner

*Primary Examiner*—Thien M. Le
*Assistant Examiner*—April A. Taylor
(74) *Attorney, Agent, or Firm*—Tue Nguyen

(57) ABSTRACT

A thin film non volatile memory scalable to small sizes and its fabrication process are disclosed. The thin film memory includes a thin film transistor control circuitry fabricated on a flexible substrate, together with an optoelectronic cross bar memory employing a photoconducting material. The thin film non volatile memory can be used in RFID communication tag with the control circuitry further employing wireless communication circuitry such as an antenna, a receiver, and a transmitter.

26 Claims, 4 Drawing Sheets

THIN FILM NON VOLATILE MEMORY DEVICE SCALABLE TO SMALL SIZES

FIELD OF THE INVENTION

This invention is related to the provision of small, thin information appliances or computing devices which have a need for nonvolatile rewriteable digital memory.

BACKGROUND OF THE INVENTION

Currently there is a strong trend toward the development of very low cost RFID tags, relatively small scale integrated circuits whose input and output, via radio frequency radiation, uses transponders rather than receivers and transmitters, which are cheap enough to achieve ubiquitous deployment on essentially any object whose location and movement are of interest. Such tags would simplify and expedite many tasks, including keeping track of and streamlining inventories, preventing theft and counterfeiting, guaranteeing product authenticity, and monitoring environmental conditions experienced by the object. Preferably they should be available in the form of labels which can be easily attached to objects. Some objects, such as secure papers (for example currency, identification documents (including tickets), and certificates or other legal documents) are thin and flexible, and any electronics attached to them should be unobtrusive and preferably invisible.

In many cases, it is desirable for the tags to include some memory beyond the minimal amount required for simple unique identification of the object. For example, a tag may contain information regarding a person's medical history or special needs, or it might contain extensive information regarding proper handling procedures of a product. Memory requirements will vary widely, but often are in the range of 1 kilobyte (kB) to 10 kB, although they may be more or less than these values; some tags are offered with 256 bytes of memory, and some with 256 kB.

Current products do not adequately address these needs. Conventional silicon chips are thick (0.5 mm before thinning), brittle, and too expensive to meet the <5¢ per tag cost target that most customers quote. The cost of finished CMOS ICs has been approximately $4/cm$^2$, or 4¢/mm$^2$, for many years, and while costs per transistor continue to decrease with device scaling, areas costs do not. In addition to the basic chip cost, one must include thinning, dicing, placement, and wire-bonding to an antenna. Even after this, the product has problems, including the fragility of the chip-antenna connection and remaining thickness of silicon. It will be very difficult to incorporate such devices unobtrusively into paper documents.

Another major difficulty with existing solutions is that conventional silicon nonvolatile memory (which comes in two closely related varieties: EEPROM, or electrically erasable and programmable read-only memory, and FLASH memory) is substantially more expensive than CMOS logic circuitry, and requires a different IC process, so that it is often not fabricated in the same chip or at the same time or using the same fabrication processes as logic. Thus, to meet the need for memory described previously, it might be necessary to incorporate another chip, with some suitable connection to the processor. Such connections substantially increase the cost of the product, as well as lowering reliability.

Such nonvolatile memory chips are not only more expensive per unit area than logic chips or volative memory such as DRAM and SRAM, but they cannot be easily scaled to small sizes such as are desired for RFID tags (as well as other products, such as smart cards). Ignoring for the moment the support circuitry needed for addressing the memory, FLASH requires one transistor per bit, and so 1 kB (8 kbits) requires 8000 transistors, which in a modem (e.g. 0.13 micron design rule) integrated circuit process will occupy a square less than 50 microns on each side, which is a very small chip that cannot be produced without greatly increasing the price per unit area relative to the basic production cost of ordinary memory chips. Thus, one is again confronted with the difficulty of getting the amount of circuitry needed at an acceptable price.

Scalable memory materials better suitable for this application might be organic memory materials such as a Zn porphyrin photoconductive thin film disclosed in Liu et al., U.S. Pat. No. 5,327,373 ("Optoelectronic memories with photoconductive thin films", Jul. 5, 1994) and its division U.S. Pat. No. 5,424,974, hereby incorporated by reference. However, Liu et al. discloses the construction of rigid memory cells which are exemplified by devices constructed between glass plates into which the active material must be introduced by capillary action.

A desirable solution to these problems would be an integrated circuit (IC) which can be fabricated directly on thin substrates such as paper or paper-thin plastic, along with appropriate memory, in a single thin-film integrated process so that the antenna connection is made by the simplest possible techniques, with the greatest possible longevity. It is desirable that the memory be available in the same process, in amounts of about 1 kB to 100 kB (more or less), at a cost that is not a major increase relative to the cost of the circuit itself.

SUMMARY OF THE INVENTION

The present invention discloses a thin film non-volatile memory device fabricated on a flexible substrate, comprising a non-volatile memory in communication with a control circuitry.

The thin film non-volatile memory is an optoelectronic cross bar memory comprising a photoconductive thin film sandwiched between two electrodes, together with a radiation source to provide irradiation to the photoconductive thin film. Under an electric field and visible irradiation, non-volatile charges are generated and stored in the photoconductive thin film and then can be read with appropriate charge sensing circuit. This effect is highly stable and repeatable, and is the basis for the present invention thin film non-volatile memory.

The control circuitry of the present invention is based on thin film silicon technology, in which thin film transistors are fabricated on plastic substrates, preferably in a process amenable to roll-to-roll processing. This potentially reduces cost and makes it possible to conveniently transfer the ICs to end-product substrates at an arbitrary density and position.

In another embodiment of the invention, the thin film non-volatile memory device is a wireless communication tag in which the control circuitry comprises a wireless communication circuit. The wireless communication circuit can employ infrared (IR) communication protocol, or microwave communication protocol, or radio frequency (RF) communication protocol. The wireless communication circuit is preferably a radio frequency identification (RFID) circuitry comprising an integrated circuit including an antenna, a receiver, a transmitter, and a microprocessor.

The present invention improves substantially to make small memory arrays economically, which is desirable for the smart tag/smart card applications, with the attendant requirement of thin, inexpensive and robust devices that can be incorporated into paper-thin products. The invention scales well to larger sizes as well.

DETAILED DESCRIPTION OF THE INVENTION

Figure 1:
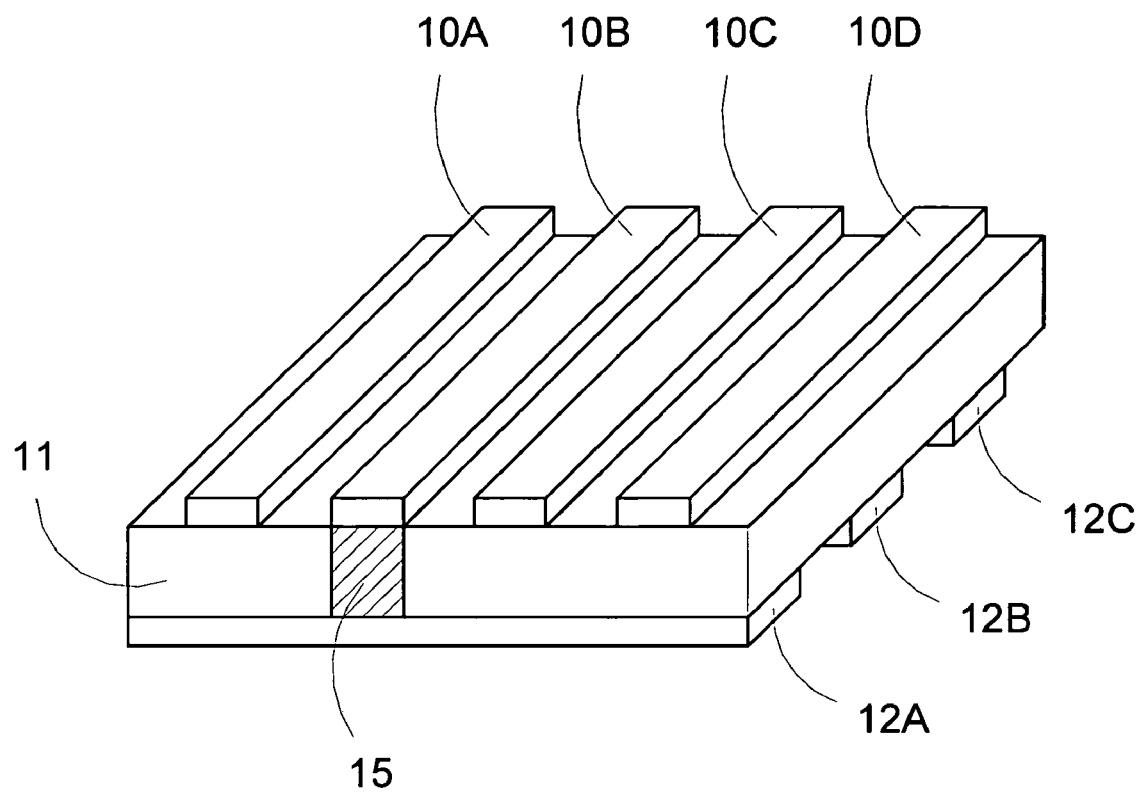
FIG. 1 is a schematic representation of a cross bar memory array.

Thin film silicon technology, in which thin film transistors are fabricated on plastic substrates, is reasonably well known and well documented. The thin film transistors (TFTs) resulting from these processes, which use amorphous silicon (a-Si) as the active semiconductor material, are suitable for general computational operations as well as other applications such as display switching elements. They can be used to read and write information from EEPROM cells, for example, as well as to make oscillators and logic gates. Because they are fabricated on plastic substrates, the process is amenable to adaptation to roll-to-roll processing with attendant cost reductions, and the substrate can be sufficiently thin that it is easily accommodated in the thin RFID devices and smart tags or cards which are the primary (though not exclusive) focus of this invention.

The prior art memory cells, while satisfactory to store digital information, do not meet the needs of the applications cited earlier in many ways. They are not cheaper than logic; indeed there is at least one extra processing step (including an extra lithographic masking layer) which adds significant complexity and cost to the manufacture. They cannot withstand more cycles of rewriting than conventional FLASH memory (ca. 100,000). If they are made on plastic, using conventional lithography processes with their attendant limitations on plastic substrates, the transistor footprint would be at least 15 microns or more, and just 1 kB adds at least 1.5 mm$^2$ plus control circuitry to the area of the device.

Organic memory materials are better suited for this application due to the cost scalability and the possible fabrication process on a flexible substrate. The disclosed thin film memory is an optoelectronic cross bar memory comprising a photoconductive thin film sandwiched between two electrodes, together with a radiation source to provide irradiation to the photoconductive thin film. In this system, a thin film, about 1.5 microns thick, of an organic molecule, preferably a Zn porphyrin with hydrocarbon chain substituents, is sandwiched between two electrodes, one of which must be transparent (for example indium tin oxide, or ITO). When both electrical bias (of about 1-10V) and visible irradiation (at about 20 microwatts/cm$^2$) are supplied, charge is stored in the photoconductive porphyrin film. After this "writing" step, if the electrodes are short circuited under visible irradiation, a current spike is observed which is far larger than the normal steady state photocurrent. This effect is highly stable and repeatable, and can be used as the basis for non-volatile solid state memory. In a typical architecture called a cross bar array, the active material is placed between crossed electrodes, so that a bit location can be selected as the intersection of a particular row and column, similar to the pixels of a matrix-addressed display. This is the same addressing method as is used for other solid state memory arrays such as SRAMs and FLASH, but does not require transistors to be located at each crosspoint. It is similar in this respect to a passive matrix display as implemented, for example, with certain liquid crystals.

Read and write electronic circuits for the photoconductive memory are different from the circuits for silicon memory such as EEPROM or FLASH. The design and positioning of these circuits with respect to the memory cells is critical, and the photoconductive memory circuits cannot be optimized by a straightforward application of standard sense amplifiers used for the control of information storage in other media such as dynamic or static random access memories, EEPROMs, FLASH, etc. Due to the magnitude of the currents that flow upon short-circuiting a small (micron-sized) memory element, attention to minimization of noise and parasitic effects is vital. Thus, it is important to place the input of the read amplifier as close to the end of the line (row or column) of the matrix as possible. Calculations indicate that in practice, it is desirable that the lines be no longer than about 1 cm, and the amplifiers should be within microns (less than 100 microns, and preferably less than 10 microns) of the line ends.

The present invention is a flexible non-volatile memory device built on a flexible substrate and comprising thin film transistor control circuitry with an optoelectronic cross bar memory in communication with the control circuitry.

The control circuitry is provided by the thin film transistors (TFTs) on a flexible substrate such as plastic or paper substrate. Because these transistors can be fabricated on the same flexible substrate as the memory, and both are thin film devices whose total thickness is only a few microns or less, it is feasible to ensure that the distance between the ends of the memory matrix lines and the inputs of the controlling transistors is very small, of the order of a few microns.

The optoelectronic memory is based on the principle of generation and storage of charges in photosensitive organic compounds due to the simultaneous application of an electric field and a pulse of visible light. The optoelectronic memory comprises a memory material, two electrodes (a bottom electrode and a top electrode) arranged in a cross bar configuration and sandwiching the photoconductive thin film to provide an electric field to a selected portion of the photoconductive thin film, and an electromagnetic radiation source to irradiate a portion of the photoconductive thin film. The electromagnetic radiation source is preferably a visible, infrared or ultraviolet light source.

The memory materials in the optoelectronic memory are generally photoconductive thin films in which charge separations within the material are generated in the light and then trapped when the light is removed. The typical photoconductive materials are (metal)(β-decoxyethyl) porphyrins, where metal can be Zn, Cu, Co, Ni and Pd, and in $C_{10}$ derivatives of these compounds, and in non-liquid crystal $H_2$ octakis (β-decoxyethyl) porphyrin. Other classes of photoconductive materials include aromatic compounds, phthalocyanines, organometallic compounds and metal complexes. The photoconductive memory materials are preferably solid thin films at room temperature and exhibit high photoconductivity but low dark conductivity, typically less than about $10^{-7}$/Ohm-cm for short term memory applications and less than about $10^{-14}$/Ohm-cm for long term applications. The preferred photoconductive film thickness is about 0.3 μm to 3 μm.

FIG. 1 shows the schematic of a cross bar memory array. The top electrodes 10A, 10B, 10C, 10D are parallelly arranged in one direction, and the bottom electrodes 12A, 12B, 12C are also parallelly arranged in the direction perpendicular to the top electrodes. The memory material 11 is sandwiched between the top electrodes and the bottom electrodes. When a potential is applied between a selected top electrode 10B and a selected bottom electrode 12A, only a section 15 of the memory material 11 is under the electric field created by the overlap of the top electrode 10B and the bottom electrode 12A. Thus the memory cell 15 can be selectively chosen to read or write.

Figure 2:
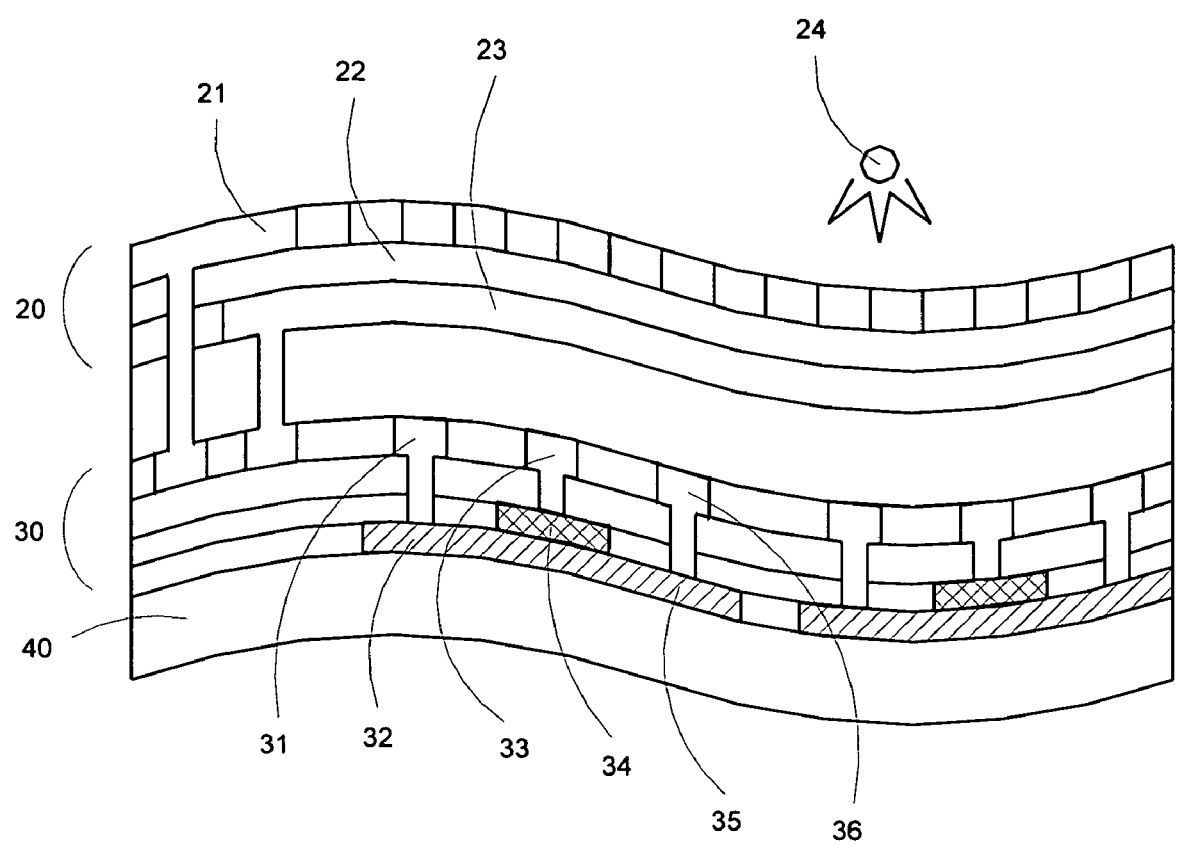
FIG. 2 is a schematic representation of an embodiment of the present invention.

FIG. 2 shows a schematic of the present invention, comprising a memory 20 on a thin film transistor circuitry 30 on a flexible substrate 40. The memory 20 comprises the bottom electrodes 23, the top electrodes 21, the memory material 22, and the light sources 24. The thin film transistor 30 comprises the interconnection 31, 32, and 33 connected to the source 34, the gate 35 and the drain 36 respectively.

In another embodiment of the invention, the thin film non-volatile memory device is a wireless communication tag in which the control circuitry comprises a wireless communication circuit. In recent years, automatic identification systems have become popular in many service industries to provide information about price, available goods and products. The data is normally stored in a memory chip, and the data transfer between the tag carrying the data and the stationary reader is preferably contactless to allow the flexibility and the mobility of the identification system. The contactless ID systems are often called RFID (radio frequency identification) systems based on the frequency of the transfer signals. However, the wireless communication circuit can also employ infrared (IR) communication protocol, or microwave communication protocol, in addition to radio frequency (RF) communication protocol.

The wireless communication circuit in the present invention preferably comprises a radio frequency identification (RFID) circuitry comprising an integrated circuit including an antenna, a receiver, a transmitter, and a microprocessor.

Figure 3:
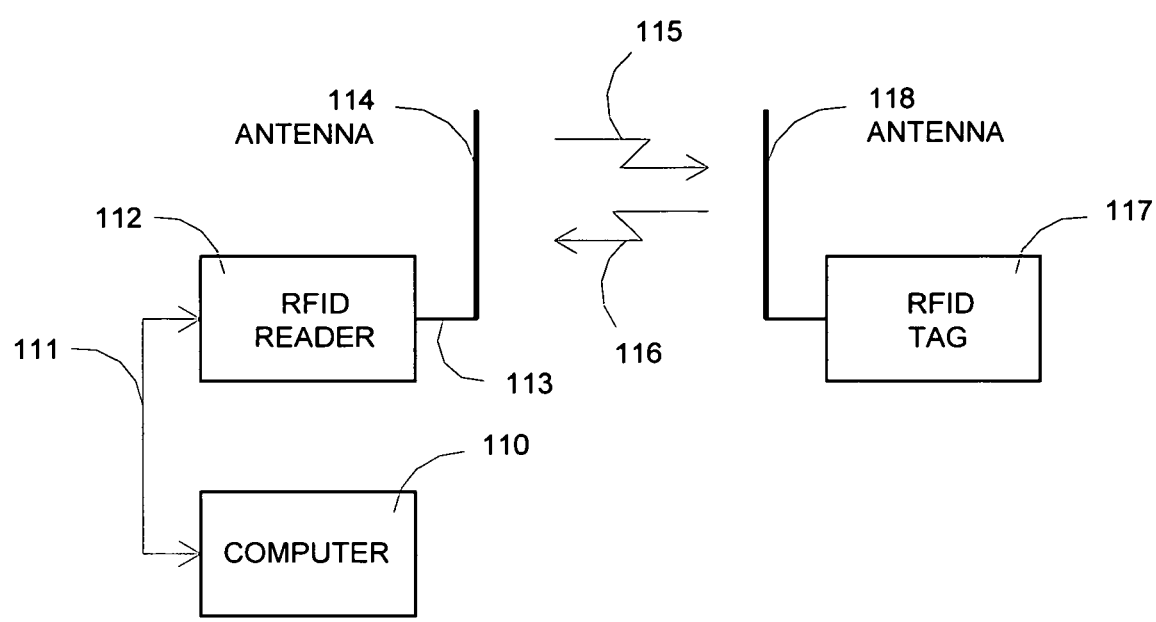
FIG. 3 is a diagram of a RFID system.

FIG. 3 shows a system mechanism chart for the complete RFID system using a transponder. The RFID system consists of the host side, which is composed of a personal computer 110, a controller 112, an antenna 114 and a data cater 117, such as a RFID tag having an antenna 118. A bus 111, such as RS-232, connects computer 110 and controller 112, and a cable 113 connects controller 112 and antenna 114. Antenna 114 sends power and command data 115 to carrier 117 and receives data 116.

Figure 4:
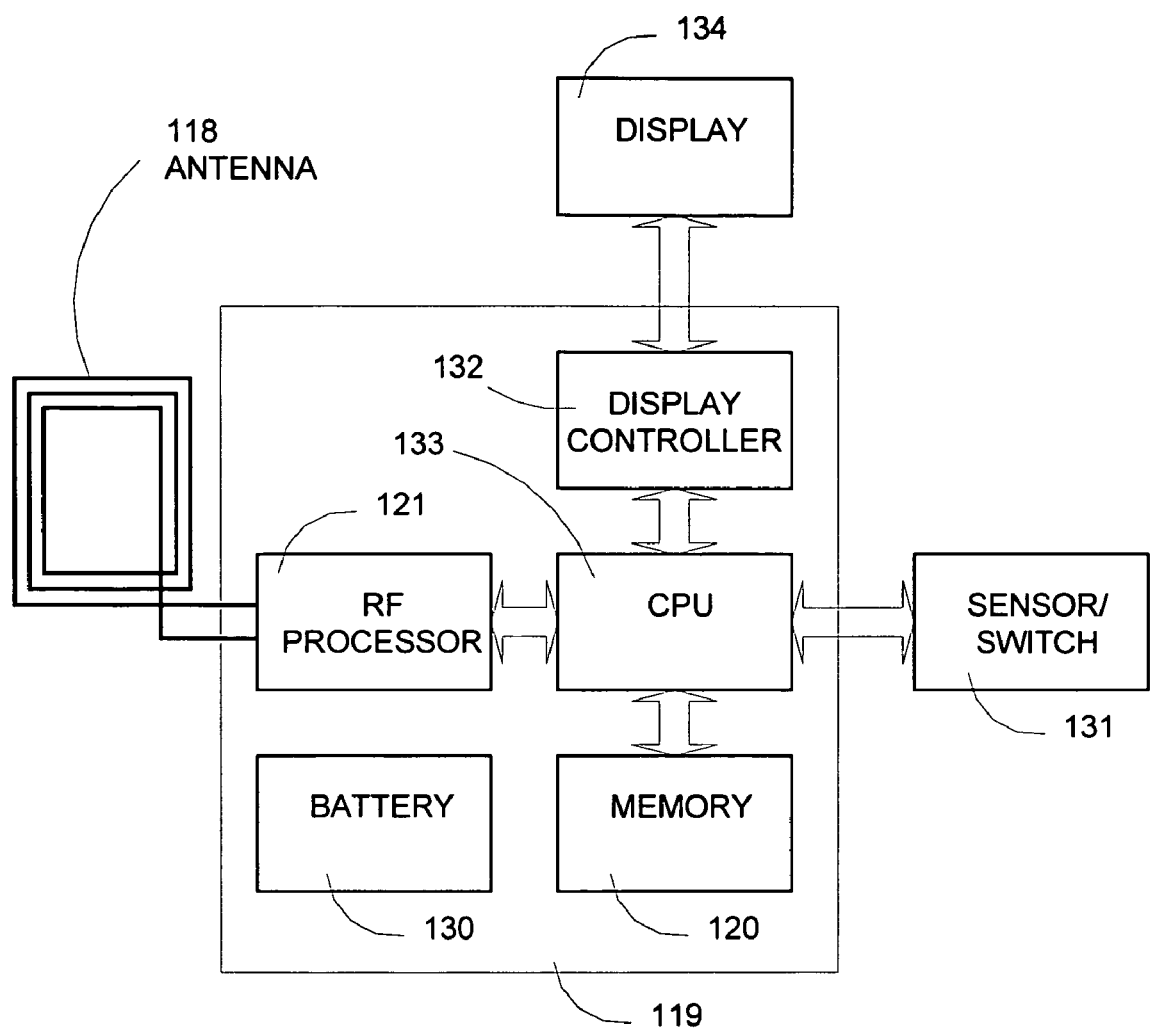
FIG. 4 is a diagram of a RFID tag.

The diagram of an RFID tag is shown in FIG. 4. The transponder has a simple structure, which contains a RFID circuitry 119 within a board, and an antenna 118 which functions as a power receiver, data receiver/transmitter together. The RFID chip 119 may contain a memory array 120, an ASIC RF front end processor 121, a central processor CPY 133, a battery 130 and an optimal controller 132. Command information and data are transmitted and received between the RFID circuitry and the RFID reader through the antenna 118. The CPU 133 may comprimise added security system to prevent unauthorized data accessing. The display 134 is connected to the RFID circuitry through a display controller 132. A sensor/switch 131 is connected to the RFID circuitry through the CPU 133.

The present invention further discloses a method to fabricate a flexible non-volatile memory device. The fabrication process starts with a flexible substrate, and continues with the fabrication of a thin film transistor control circuitry on the flexible substrate, and the fabrication of an optoelectronic cross bar memory. The thin film transistor control circuitry is designed to have a plurality of contact pads for electrical communication with the optoelectronic memory. The fabrication of the optoelectronic memory comprises the fabrication of the bottom electrodes contacting the control circuitry, the deposition of a photoconducting thin film, and the fabrication of top electrodes, also preferably contacting the control circuitry, and the fabrication of an electromagnetic radiation source for irradiating a portion of the photoconductive thin film.

The electrodes of the memory can be fabricated on top or on the sides of the finished transistors of the control circuitry. It is preferable to fabricate the memory electrodes on top of the control circuitry rather than to place the electrodes in a separate area, because it is less expensive. If the electrodes and circuitry are placed next to each other, the cost of the memory per unit area cannot be less than the cost of the circuitry (and must in fact be more), since the memory area runs through the same process steps (idle) as the TFTs. In the present configuration it is possible to fabricate the crossbar memory array at an estimated cost per bit of ⅕ or less of the cost of equivalent transistor memory. After the cost of control circuitry is included, the savings are still quite large.

Although the TFT example described above used amorphous silicon transistors, the invention is not limited to this type. Various types of semicrystalline silicon material, described in the literature as microcrystalline or nanocrystalline silicon, are known which can be deposited without further treatment with charge carrier mobilities greater than amorphous silicon, in particular at least 10 cm$^2$/Vs or higher, and with the mobility of p-type material comparable to that of n-type. Thus not only can one make circuits which switch at a higher frequency and can be fabricated more densely, but one can make CMOS circuits which consume much less power than NMOS or PMOS circuits. The deposition processes used for this microcrystalline material, while requiring higher temperatures (up to around 300° C.) are still compatible with the use of plastic substrates and roll-to-roll processing.

It is also possible to produce polycrystalline silicon, with mobilities in excess of 100 cm$^2$/Vs and up to several hundred, by use of various annealing techniques. These techniques may make use of an excimer laser to recrystalize the silicon at a relatively low substrate temperature (down to 100° C. in some cases), or they may use small amounts of certain metal elements such as nickel, in a process known as metal-induced crystallization, which can be practiced at temperatures down to around 450° C. As with the microcrystalline material, these processes lead to both n and p type devices with comparable performance.

Some of the techniques known in the art for producing polycrystalline silicon with high mobility, in particular the metal-induced crystallization, require temperatures that are incompatible with most plastics, especially transparent ones. For use in the present invention, at least the top layer substrate must be transparent to visible light. However, these devices can still be incorporated into the subject invention. This may be done using the lamination/transfer technique using thermally decomposable polymers, as described in a co-pending U.S. Application entitled "*Lamination and delamination technique*", application Ser. No. 10/444,219, filed May 23, 2003, hereby incorporated by reference. With this technique, transistors can be fabricated on a substrate which can withstand very high temperatures (it may even be a metal substrate), transferred to a temporary transfer substrate (placed on top of the transistors), and then transferred again onto whatever substrate is desired. These transfers require only low substrate temperatures (100° C.). The transfer technique is not limited to use with devices fabricated on flexible substrates: it can be used to transfer devices from rigid substrates, including glass, to flexible substrates. Other techniques for transferring such devices from glass to plastic are also known; for example that described by Seiko-Epson Corporation, in *IEEE Trans. Electron Devices*, vol. 49, p. 1353 (2002).

Once the necessary control circuitry has been prepared, the bottom electrodes of the memory array (which do not need to be transparent) are conveniently fabricated on top of the TFT circuitry, by formation of vias aligned with the TFT contact pads, followed by deposition of a metal layer that is patterned into array lines. The organic layer is then deposited by inkjet printing, or alternatively by other printing techniques capable of depositing a layer of organic liquid (melting at around 130° C.) in a uniform layer of about 1.5 microns thickness.

Next the top electrodes (ITO or other transparent conductor), with connections to control electronics, must be formed. In addition, a light source, capable of providing at least 10-20 microwatts/cm$^2$ of visible, infrared or ultraviolet light through the ITO electrodes, must be available. Thus, the top layers are preferably not of the same structure as the bottom, since the circuitry would obscure the light, which will typically come from an LED or other small, efficient light source embedded in the plastic substrate above the circuitry. In this embodiment, therefore, the array lines are connected to circuitry in the bottom electrode layer by an interconnection which is formed between the laminated layers.

This may be accomplished either by direct connection of pads at the ends of the array lines with corresponding pads in the bottom layer, or by connection of contact pads for drive circuitry, especially multiplexers, which may be fabricated in the top layer. The former approach requires simpler preparation for the top layer (only the electrode lines) but more demanding alignment to the bottom layer (since the pads cannot be larger than the array linewidth). The latter approach can make use of large (many microns wide) pads which are easier to align, but requires some circuitry to be constructed in the top layer; the minimum requirement being multiplexer circuits which lessen the number of input/output pads. If the array element widths are greater than about 1 micron, alignment of the two substrates is feasible and the former method may be used.

For array element widths less than about 1 micron, use of the latter method would become highly desirable since aligning two separate substrates to the required accuracy would be very difficult. In order to keep the cost of the top layer as low as possible, it will be preferable to use the transfer technique described previously to position the necessary circuits around the array. In this way it is not necessary to process the entire area of the top electrode array through the transistor fabrication processes. The invention does not require the transfer process for this purpose, however; it only is useful to reduce cost.

When the array is constructed using one of these techniques, the light source is conveniently provided by embedding an inorganic LED (for example GaInN) chip in the top of the top plastic substrate. Such chips can be obtained in sizes of a few hundred microns. A receptor well can be made for the LED by mechanical indentation. Contact to this chip for power supply will be made by a printed conductor line (printed, for example, by inkjet printing of an ink that is a precursor for a conductive line, as supplied for example by Flint Ink or Parelac). This line will be run to a via (preferably made by laser ablation; it can be relatively large, for example 25-50 microns wide, as there is no special microscale constraint on it) through the top substrate down to the bottom substrate and a corresponding pad which connects to the control circuitry in the bottom layer. The only purpose of this LED is to be on during read and write operations, and only two lines need to run to it.

Another method to provide illumination is to couple light into the top substrate from the side, using an edge-emitting LED which is located at the edge of the top substrate tile, and optically connected with a small droplet of index-matched polymer applied by inkjet printing. Because the ITO electrodes form a periodic array with a spatial periodicity of the order of the wavelength of visible light, they will scatter some of the waveguided light out of the plane of the substrate and into the porphyrin. In this case, control circuitry can be fabricated underneath the top electrodes similarly to that under the bottom electrodes, and the interconnection of the two is much simpler, because it requires only a small number of signal lines. These would be transmitted through more conventional contact pads which might be, for example, 50-100 microns on a side, and these contacts can then be made with commercially available z-axis adhesives, such as are available from Hitachi Chemical, for example.

The connection of the LED is again provided by laser drilling of two vias and connection with conductive metal ink precursors, which can be conveniently printed. In order to obtain optimum uniformity of illumination, it may be necessary to place LEDs on each side of the square array.

Both of the alternatives described up to now use a lamination technique to put two electrodes together around the photoconducting memory material. It is also possible to deposit the top electrode array directly on the photoconducting memory material. The substrate temperature should be kept to less than 130° C., preferably less than about 100° C., in order to remain well below the melting temperature of the photoconducting memory material. ITO can be deposited at such lower temperatures; although its conductivity is not as high as when it is deposited at higher temperatures, the conductivity required for the present memory device is not high. The current flowing through a 4 micron line will be of the order of 100 pA, which corresponds to 25 mA/cm$^2$, assuming 100 nm thick interconnect metal lines.

If such a deposition process is used, it is important to minimize the ion bombardment of the organic surface, which can be easily degraded by such high energy processes. Careful control of plasma parameters to minimize such bombardment, and the energy of the ions, can be achieved, for example by minimizing rf power. A high-density plasma such as an ECR system is advantageous.

ITO is commonly deposited by sputtering, as this process tends to give optimum control over material qualities with readily available commercial equipment at high deposition rates. However, it may also be deposited by reactive evaporation, pulsed laser deposition, ion beam assisted deposition, and other techniques, which have been carried out at low substrate temperatures (e.g. room temperature) on polymer substrates as well as directly on organic light emitting materials. The combination of low substrate temperature and low intensity of ion bombardment tends to lead to relatively low ITO conductivity. In addition, these techniques tend to produce lower deposition rates than are commercially desirable. However, it is possible to obtain satisfactory conductivity at substrate temperatures below 130 C and with low ion bombardment from these techniques, which may be used to deposit a very thin layer. After about 2-5 nm of thickness has been deposited, the organic layer is fully protected from the deleterious effects of ion bombardment, conventional rf or magnetron sputtering can be used to complete the required film thickness.

It is also possible to use conducting polymers, such as poly(ethylenedioxythiophene), or PEDOT, as the top, transparent electrode. PEDOT can be patterned by photochemical techniques.

It is also possible to interpose a very thin layer of conducting inorganic material between the organic layer and the ITO. Gold and silver are both examples of metals with high conductivity which remain highly transparent in thickness of a few nanometers, which is enough to protect the organic layer from the effects of conventional ITO deposition.

It is also possible to use other transparent conducting oxides than ITO, for example Al-doped ZnO, Sb-doped SnO, and others which are well known in the art.

In both cases, there is no need either for circuitry in the top layer, or for any complex interlayer connection process. The ends of the top array lines are connected to corresponding contact pads in the bottom electrode layer by ordinary planar processing.

The advantage of this invention is that the cost of processing the layers required to form the memory is substantially less than that required for TFTs, since only two conventional lithographic steps (patterning of the electrodes) is required, and fewer (and less complex) depositions as well. The memory can also be made more dense, since the lateral density is determined only by the lithography of the array, and so the area occupied by a bit can easily be made much smaller than the area occupied by a transistor plus floating gate and associated address lines, as required for FLASH memory. A rough estimate of the cost savings is that the cost per unit area should be in the vicinity of $\frac{1}{3}$ of the cost of transistor fabrication (based primarily on the reduction in lithography), and the density of bits, using the same lithographic tools, should be about a factor of 25 greater; hence the cost per bit should be around $\frac{1}{75}$ as much.

The invention improves substantially on the prior art in that it is now possible to make small memory arrays economically, which is what is desired for the smart tag/smart card applications, with the attendant requirement of thin, inexpensive and robust devices that can be incorporated into paper-thin products. The invention scales well to larger sizes as well.

If amorphous silicon transistors are used, the performance of the memory is currently limited by the charge carrier mobility to less than 1 MHz clock frequency. This is not a limitation for the intended application today, since readout times of approximately 1 second for the entire memory of 1 kB-10 kB is well within the capability of the circuitry.

Another feature of amorphous silicon is the fact that only n-doped devices are realistic in current technology, since p-doped devices are even slower (by two or three orders of magnitude). Again, this feature does not affect the intended application since the major concern of having only n-type devices is power consumption (CMOS does not consume power unless actually switching, while NMOS does), and the RFID-type products are not operated continuously for long periods.

Another limitation of amorphous silicon is the fact that only n-doped devices are realistic, since p-doped devices are even slower (by two or three orders of magnitude). Again, this limitation does not affect the intended application since the major concern of having only n-type devices is power consumption (CMOS does not consume power unless actually switching, while NMOS does), and the RFID-type products are not operated continuously for long periods.

The invention is not confined to the use of amorphous silicon, however, although that represents the currently cheapest and most available circuit technology. Other circuit solutions, including microcrystalline and polycrystalline silicon, are also applicable and appropriate, as has already been discussed. These can implement CMOS, and work at many MHz clock speeds.

What is claimed is:

1. A flexible non-volatile memory device comprising
   a flexible substrate;
   a thin film transistor control circuitry formed on the flexible substrate; and
   an optoelectronic cross bar memory in communication with the control circuitry, the optoelectronic cross bar memory comprising
   a photoconductive thin film;
   a plurality of bottom electrodes and a plurality of top electrodes arranged in a cross bar configuration, sandwiching the photoconductive thin film to provide an electric field to selected portion of the photoconductive thin film; and
   an electromagnetic radiation source to irradiate a portion of the photoconductive thin film;
   wherein the photoconductive thin film stores trapped charges generated by the electromagnetic radiation.

2. A device as in claim 1 wherein the flexible substrate is a plastic or paper substrate.

3. A device as in claim 1 wherein the photoconductive film thickness is between 1 to 2 µm.

4. A device as in claim 1 wherein the photoconductive film is (metal)(beta-decoxyethyl)porphyrins wherein the metal is selected from a group consisting of Cu, Co, Ni, Pd.

5. A device as in claim 1 wherein the photoconductive film is zinc-octakis(beta-decoxyethyl)porphyrins.

6. A device as in claim 1 wherein the photoconductive film is phthalocyanine, an aromatic compound, or an organo-metallic compound.

7. A device as in claim 1 wherein the electromagnetic radiation source is a visible, infrared or ultraviolet light source.

8. A device as in claim 1 wherein the optoelectronic cross bar memory is positioned on top of thin film transistor control circuitry.

9. A device as in claim 1 wherein the optoelectronic cross bar memory is positioned on the flexible substrate, beside the thin film transistor control circuitry.

10. A device as in claim 1 wherein the top electrode material is transparent to the electromagnetic radiation.

11. A device as in claim 1 wherein the top electrode material is indium tin oxide, another inorganic transparent conducting oxide, a conducting polymer, or poly(ethylenedioxythiophene).

12. A device as in claim 1 wherein the electromagnetic radiation source is positioned on top of the top electrodes.

13. A device as in claim 1 wherein the electromagnetic radiation source is positioned on the edge of the top electrodes.

14. A RFID device comprising
    a semiconductor substrate;
    a transistor control circuitry formed on the semiconductor substrate comprising a wireless communication circuit; and
    an optoelectronic cross bar memory in communication with the control circuitry, the optoelectronic cross bar memory comprising a photoconductive thin film;

a plurality of bottom electrodes and a plurality of top electrodes arranged in a cross bar configuration, sandwiching the photoconductive thin film to provide an electric field to selected portion of the photoconductive thin film; and an electromagnetic radiation source to irradiate a portion of the photoconductive thin film;

wherein the photoconductive thin film stores trapped charges generated by the electromagnetic radiation.

15. A device as in claim 14 wherein the wireless communication circuit employs IR communication protocol.

16. A device as in claim 14 wherein the wireless communication circuit employs microwave communication protocol.

17. A device as in claim 14 wherein the wireless communication circuit employs radio frequency communication protocol.

18. A device as in claim 14 further comprising a battery to supply power to the whole circuitry.

19. A device as in claim 18 wherein the battery is a thin film battery.

20. A device as in claim 14 wherein the wireless communication circuit comprises an antenna.

21. A device as in claim 14 wherein the flexible substrate is a plastic or paper substrate.

22. A device as in claim 14 wherein the photoconductive film thickness is between 1 to 2 μm.

23. A device as in claim 14 wherein the photoconductive film is (metal)(beta-decoxyethyl)porphyrins wherein the metal is selected from a group consisting of Cu, Co, Ni, Pd.

24. A device as in claim 14 wherein the photoconductive film is zinc-octakis(beta-decoxyethyl)porphyrins.

25. A device as in claim 14 wherein the photoconductive film is phthalocyanine, an aromatic compound, or an organo-metallic compound.

26. A device as in claim 14 wherein the electromagnetic radiation source is a visible, infrared or ultraviolet light source.

* * * * *